(12) United States Patent
Dierksmeier et al.

(10) Patent No.: US 10,801,408 B2
(45) Date of Patent: Oct. 13, 2020

(54) GAS TURBINE ENGINE WITH THERMOELECTRIC SYSTEM

(71) Applicant: Rolls-Royce North American Technologies, Inc., Indianapolis, IN (US)

(72) Inventors: Douglas D. Dierksmeier, Franklin, IN (US); Daniel K. Vetters, Indianapolis, IN (US); Michael A. Karam, Plainfield, IN (US)

(73) Assignee: Rolls-Royce North American Technologies Inc., Indianapolis, IN (US)

( * ) Notice: Subject to any disclaimer, the term of this patent is extended or adjusted under 35 U.S.C. 154(b) by 1000 days.

(21) Appl. No.: 15/416,730

(22) Filed: Jan. 26, 2017

(65) Prior Publication Data

US 2018/0030897 A1    Feb. 1, 2018

Related U.S. Application Data

(60) Provisional application No. 62/290,647, filed on Feb. 3, 2016.

(51) Int. Cl.
| | |
|---|---|
| *F02C 7/14* | (2006.01) |
| *F02C 7/22* | (2006.01) |
| *F01D 25/18* | (2006.01) |
| *F02C 7/12* | (2006.01) |
| *F01D 15/10* | (2006.01) |
| *H01L 35/30* | (2006.01) |
| *F02C 6/18* | (2006.01) |
| *F01D 25/12* | (2006.01) |
| *H01L 35/00* | (2006.01) |
| *F02K 9/40* | (2006.01) |

(52) U.S. Cl.
CPC .............. *F02C 7/12* (2013.01); *F01D 15/10* (2013.01); *F01D 25/12* (2013.01); *F01D 25/18* (2013.01); *F02C 6/18* (2013.01); *F02C 7/14* (2013.01); *F02C 7/22* (2013.01); *H01L 35/00* (2013.01); *H01L 35/30* (2013.01); *F02K 9/40* (2013.01); *F05D 2260/213* (2013.01); *Y02T 50/671* (2013.01); *Y02T 50/675* (2013.01)

(58) Field of Classification Search
USPC .................................................... 62/3.7, 3.61
See application file for complete search history.

(56) References Cited

U.S. PATENT DOCUMENTS

| | | | |
|---|---|---|---|
| 2,990,775 A | | 7/1961 | Henson |
| 4,020,632 A | * | 5/1977 | Coffinberry ............... F02C 7/14 |
| | | | 60/773 |

(Continued)

FOREIGN PATENT DOCUMENTS

| | | |
|---|---|---|
| EP | 0391609 A1 | 10/1990 |
| EP | 0698730 A2 | 2/1996 |
| EP | 1746257 A2 | 1/2007 |

OTHER PUBLICATIONS

Extended European Search Report, European Application No. 17154363.0-1607, dated Jun. 21, 2017, 7 pages.

*Primary Examiner* — Gerald L Sung
*Assistant Examiner* — Rene D Ford
(74) *Attorney, Agent, or Firm* — Barnes & Thornburg LLP

(57) ABSTRACT

A gas turbine engine includes a lubrication system, fuel system and thermoelectric heat exchanger adapted for selective operation in response to operational states of the gas turbine engine.

17 Claims, 5 Drawing Sheets

(56) References Cited

U.S. PATENT DOCUMENTS

| | | |
|---|---|---|
| 6,481,211 B1 | 11/2002 | Haas |
| 7,013,636 B2 | 3/2006 | Iya et al. |
| 7,478,525 B2 | 1/2009 | Iya et al. |
| 7,984,606 B2 * | 7/2011 | Smith ................ F02C 7/14 60/266 |
| 8,484,983 B2 * | 7/2013 | Gao ................ B64D 13/06 60/266 |
| 2003/0234008 A1 | 12/2003 | Van Winkle |
| 2009/0084112 A1 | 4/2009 | Ham |
| 2009/0151321 A1 | 6/2009 | Jarmon et al. |
| 2010/0011781 A1 * | 1/2010 | Lents ................ B64D 13/00 62/3.7 |
| 2010/0236595 A1 | 9/2010 | Bell et al. |
| 2012/0118345 A1 | 5/2012 | Stoia et al. |

\* cited by examiner

|  | Ground Idle | Takeoff | Climb | Cruise | Flight Idle |
|---|---|---|---|---|---|
| Power OUT |  | X |  |  |  |
| Power IN (MODE A) |  |  | X | X |  |
| Power IN (MODE B) | X |  |  |  | X |

*FIG. 6*

GAS TURBINE ENGINE WITH THERMOELECTRIC SYSTEM

CROSS REFERENCE TO RELATED APPLICATIONS

This application claims priority to and the benefit of U.S. Provisional Patent Application No. 62/290,647, filed 3 Feb. 2016, the disclosure of which is now expressly incorporated herein by reference.

FIELD OF THE DISCLOSURE

The present disclosure relates generally to gas turbine engines, and more specifically to the interaction of subsystems used in gas turbine engines.

BACKGROUND

Gas turbine engines are used to power aircraft, watercraft, power generators, and the like. Gas turbine engines typically include a compressor, a combustor, and a turbine. The compressor compresses air drawn into the engine and delivers high pressure air to the combustor. In the combustor, fuel is mixed with the high pressure air and is ignited. Exhaust products of the combustion reaction in the combustor are directed into the turbine where work is extracted to drive the compressor and, sometimes, an output shaft, fan, or propeller.

Various portions of the gas turbine engines require lubrication to dissipate heat during operation. Heat received by the lubrication system is often transferred to cooling systems as waste heat. Meanwhile, other auxiliary systems may require addition of heat under certain operational conditions.

SUMMARY

The present disclosure may comprise one or more of the following features and combinations thereof.

According to the present disclosure, a gas turbine engine for generating power from combustion of fuel may include a lubrication system adapted to distribute lubricant to portions of the gas turbine engine, a fuel system adapted to provide fuel to a combustor of the gas turbine engine, and a thermoelectric heat exchanger including a lubrication passageway fluidly coupled to the lubrication system to pass lubricant of the turbine lubrication system therethrough, a fuel passageway fluidly coupled to the fuel system to pass fuel of the turbine fuel system therethrough, and a thermoelectric section configured in thermal communication with each of the lubrication passageway and the fuel passageway, the thermoelectric section may be disposed between the lubrication passageway and the fuel passageway.

In some embodiments, the gas turbine engine may further include a thermoelectric controller configured to determine an operational state of the gas turbine engine and to selectively apply voltage across the thermoelectric section based on the operational state of the gas turbine engine.

In some embodiments, the thermoelectric controller may be configured to selectively provide electric power generated by the thermoelectric section to a load of the gas turbine engine.

In some embodiments, the gas turbine engine may be configured to provide propulsion for an aircraft and the operational state of the gas turbine engine includes one of ground idle, takeoff, climb, cruise, and flight idle.

In some embodiments, the thermoelectric controller may be configured to receive electric power from the thermoelectric section in response to determination that the operational state of the gas turbine engine is takeoff.

In some embodiments, the thermoelectric controller may be configured to apply voltage across the thermoelectric section to direct current through the thermoelectric section in a first direction in response to determination that the operational state of the gas turbine engine is one of climb and cruise to encourage heat transfer through the thermoelectric section from the lubrication passageway to the fuel passageway.

In some embodiments, the thermoelectric controller may be configured to apply voltage across the thermoelectric section to direct current through the thermoelectric section in a second direction in response to determination that the operational state of the gas turbine engine is one of ground idle and flight idle to discourage heat transfer through the thermoelectric section from the fuel passageway to the lubrication passageway.

In some embodiments, the gas turbine engine may thermoelectric section includes a plurality of electrically connected thermoelectric layers and the lubrication passageway includes at least one lubrication conduit having at least one wall in thermal communication with one of the thermoelectric layers.

In some embodiments, the lubrication passageway includes a corrugated wall disposed within the at least one lubrication conduit.

In some embodiments, the fuel passageway includes at least one fuel conduit having at least one wall in thermal communication with one of the thermoelectric layers and the fuel passageway includes a corrugated wall disposed within the at least one fuel conduit.

According to another aspect of the present disclosure, a gas turbine engine for generating power from combustion of fuel may include a turbine lubrication system, a turbine fuel system, and a thermoelectric heat exchanger including a lubrication passageway fluidly coupled to the lubrication system to pass lubricant of the turbine lubrication system therethrough, a fuel passageway fluidly coupled to the fuel system to pass fuel of the turbine fuel system therethrough, and a thermoelectric section configured in thermal communication with each of the lubrication passageway and the fuel passageway.

In some embodiments, the gas turbine engine may include a thermoelectric controller configured to determine an operational state of the gas turbine engine and to selectively apply voltage across the thermoelectric layer based on the operational state of the gas turbine engine.

In some embodiments, the thermoelectric controller may be configured to selectively provide electric power generated by the thermoelectric section to a load of the gas turbine engine.

In some embodiments, the gas turbine engine may be configured to provide propulsion for an aircraft and the operational state of the gas turbine engine includes one of ground idle, takeoff, climb, cruise, and flight idle.

In some embodiments, the thermoelectric controller may be configured to apply voltage across the thermoelectric section to direct current through the thermoelectric section in a first direction in response to determination that the operational state of the gas turbine engine is one of climb and cruise to encourage heat transfer through the thermoelectric section from the lubrication passageway to the fuel passageway.

In some embodiments, the thermoelectric controller may be configured to apply voltage across the thermoelectric section to direct current through the thermoelectric section in a second direction in response to determination that the operational state of the gas turbine engine is one of ground idle and flight idle to discourage heat transfer through the thermoelectric section from the fuel passageway to the lubrication passageway.

In some embodiments, the thermoelectric heat exchanger may be configured to provide voltage from the thermoelectric section to generate electric power from excess thermal differential between the lubrication system and the fuel system.

According to another aspect of the present disclosure, a method of operating a gas turbine engine for providing propulsion for an aircraft includes determining an operational state of the gas turbine engine, based on the determined operational state, determining whether excess thermal differential exists between a lubrication system and a fuel system of the gas turbine engine, in response to determining whether excess thermal differential exists based on the determined operational state, selectively, applying voltage across a thermoelectric section of a thermoelectric heat exchanger of the gas turbine engine in response to determination that excess thermal differential does not exist, and extracting electric power from the thermoelectric section of the thermoelectric heat exchanger in response to determination that excess thermal differential does exist.

In some embodiments, selectively applying voltage across the thermoelectric section of the thermoelectric heat exchanger may include, in response to determination that an excess thermal differential does not exist based on the determined operational state, selectively directing current through the thermoelectric section in a first direction to encourage heat transfer through the thermoelectric section from the lubrication passageway to the fuel passageway based on the determined operational state.

In some embodiments, selectively applying voltage across the thermoelectric section of the thermoelectric heat exchanger may include, in response to determination that an excess thermal differential does not exist based on the determined operational state, selectively directing current through the thermoelectric section in a second direction to block heat transfer through the thermoelectric section from the fuel passageway to the lubrication passageway based on the determined operational state.

These and other features of the present disclosure will become more apparent from the following description of the illustrative embodiments.

BRIEF DESCRIPTION OF THE DRAWINGS

FIG. 6 is a table of exemplary operational states of the gas turbine engine of FIG. 1 adapted for use in aircraft propulsion and their general correspondence to electrical power IN (provided) and OUT (extracted) relative to the thermoelectric system.

DETAILED DESCRIPTION OF THE DRAWINGS

Figure 1:
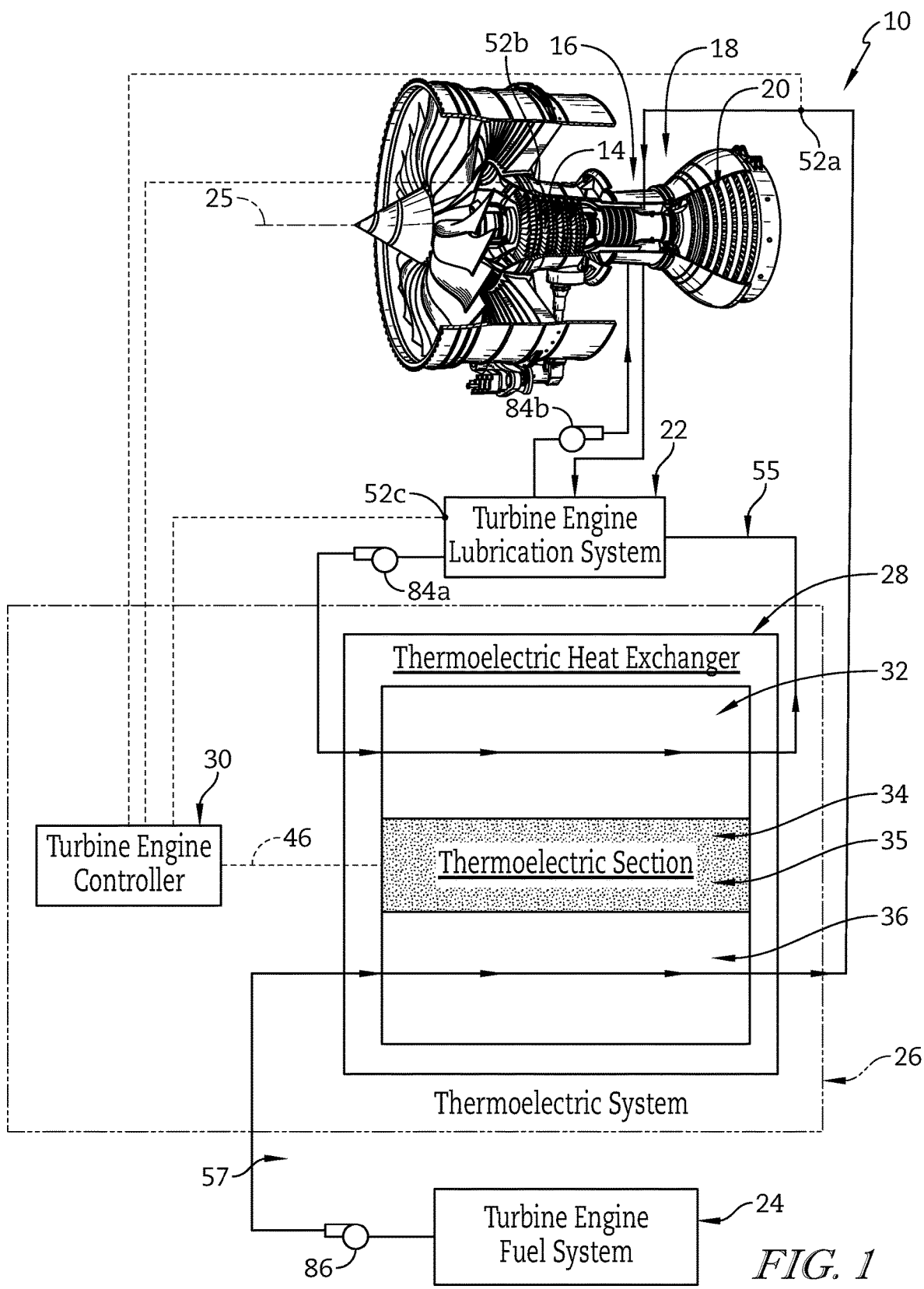
FIG. 1 is a partially diagrammatic gas turbine engine for generating thrust from the combustion of fuel diagrammatically showing that the gas turbine engine includes a turbine engine lubrication system, a turbine engine fuel system, and a thermoelectric system for controlling heat exchange between the lubrication system and the fuel system provided by a thermoelectric heat exchanger and a turbine engine controller in communication with various sensors, and showing that the thermoelectric heat exchanger has a lubrication passageway, a fuel passageway, and a thermoelectric section disposed between and in thermal communication with each of the lubrication passageway and the fuel passageway.

For the purposes of promoting an understanding of the principles of the disclosure, reference will now be made to a number of illustrative embodiments illustrated in the drawings and specific language will be used to describe the same.

An illustrative gas turbine engine 10 with a portion cut away is shown in FIG. 1 to illustrate that the engine 10 includes a compressor 14, a combustor 16, and a turbine 18. The compressor 14 compresses and delivers air to the combustor 16. The combustor 16 mixes fuel with the compressed air from the compressor 14 and combusts the mixture. The hot, high-pressure exhaust products of the combustion reaction in the combustor 16 are directed into the turbine 18 to cause the turbine blade 20 to rotate about an axis 25 to drive a load and compressor 14.

In the illustrative embodiment, gas turbine engine 10 includes a gas turbine engine lubrication system 22, a gas turbine engine fuel system 24, and a thermoelectric heat exchanger 28 as shown in FIG. 1. Fuel system 24 illustratively provides fuel to combustor 16 for combustion. Lubrication system 22 provides lubricant to various components of gas turbine engine 10 to reduce friction and remove heat therefrom. Thermoelectric heat exchanger 28 is configured to cool lubricant of lubrication system 22 using fuel from fuel system 24 as a heat sink. In the illustrative embodiment, the thermoelectric heat exchanger 28 includes a thermoelectric section or element 34 that can be operated to extract additional heat from the lubricant and to generate electrical power directly from the additional heat extracted. The additional heat extracted from the lubricant enables a reduction in the overall size of the heat exchanger 28 when compared with traditional exchangers.

In some instances of gas turbine operation, excess heat from turbine lubrication system 22 can be used in other systems of the gas turbine engine. For example, turbine fuel system 24 may benefit from supplemental heat. Excess heat from turbine lubrication system 22 can supply such supplemental heat to turbine fuel system 24 to increase engine thermal efficiency under certain operational conditions. Accordingly, lubrication-to-fuel heat exchangers needed or like thermoelectric heat exchangers, like thermoelectric heat exchanger 28, can facilitate the supplemental heat exchange.

However, the amount of excess heat available in the turbine lubrication system 22 and the amount of supplemental heat that may be useful the turbine fuel system 24 can each vary according to operational scenarios of the engine 10. The specific operational scenarios of gas turbine engines themselves can vary according to the adapted use of the engine. In the illustrative embodiment, gas turbine engine 10 is adapted for use in an aircraft and heat exchange between lubrication system 22 and fuel system 24 is described in the context of aircraft operational states including ground idle, takeoff, climb, cruise, and flight idle. In some embodiments, gas turbine engine 10 may be adapted for any known use including stationary and/or mobile electric power generation, direct and/or indirect propulsion of any manner of vehicle and/or device, and/or combinations thereof, and operational states may vary accordingly.

In the illustrative embodiment, a thermoelectric system 26 is adapted for governing heat exchange between lubrication system 22 and fuel system 24 as suggested in FIG. 1. Thermoelectric system 26 includes thermoelectric heat exchanger 28 that is controllable to regulate (i.e., to augment, encourage, or discourage) heat exchange between lubrication system 22 and fuel system 24, and a turbine engine controller 30 that determines and executes thermoelectric heat exchanger 28 operation. Thermoelectric system 26 governs heat exchange through thermoelectric heat exchanger 28 (and therefore between lubrication and fuel systems 22, 24) according to various operating conditions of gas turbine engine 10.

Thermoelectric heat exchanger 28 includes a lubrication passageway 32, a thermoelectric section 34, and a fuel passageway 36 as shown in FIG. 1. Lubricant from lubrication system 22 illustratively passes through lubrication passageway 32 in thermal communication with thermoelectric section 34. Fuel from fuel system 24 illustratively passes through fuel passageway 36 in thermal communication with thermoelectric section 34. In the illustrative embodiment, thermoelectric section 34 is disposed between the lubrication passageway 32 and the fuel passageway 36 as a thermal conduit through which heat can be communicated between the systems 22, 24. Turbine engine controller 30 illustratively operates thermoelectric section 34 to regulate heat transfer through thermoelectric heat exchanger 28.

As discussed in detail below, thermoelectric section 34 illustratively includes a thermoelectric material 35 having thermoelectric properties. In the illustrative embodiment, thermoelectric material 35 is configured such that the heat flow (rate) through the thermoelectric material 35 is regulated by selectively applying a voltage differential across the thermoelectric material, and such that application of a thermal differential across the thermoelectric material induces an electric current to flow through electrical circuitry connected to the thermoelectric material 35. Devices operating under similar principles are sometimes referred to Peltier and/or Seebeck devices.

Figure 2:
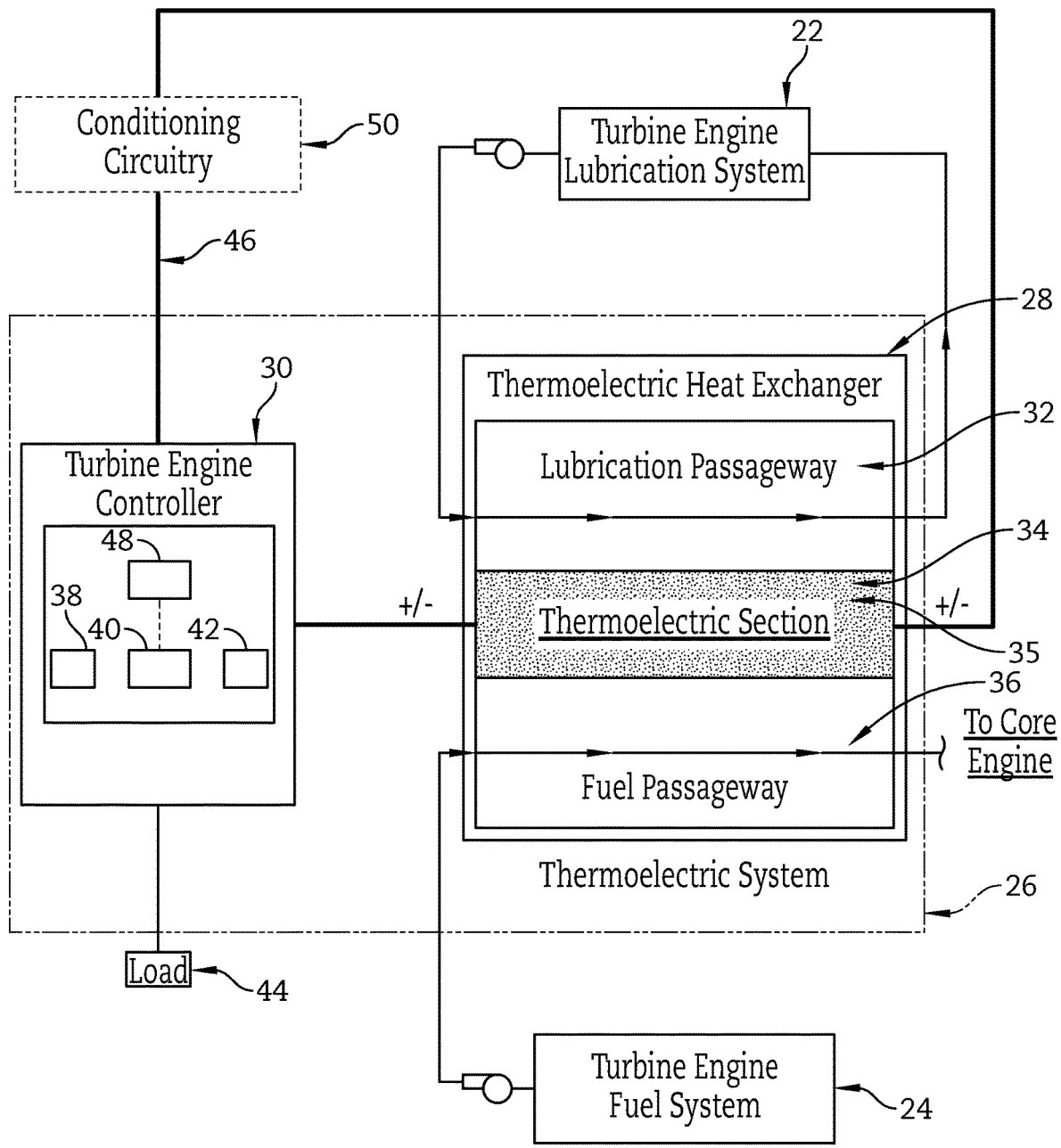
FIG. 2 is a partially diagrammatic gas thermoelectric system of the gas turbine engine of FIG. 1 showing that the turbine engine controller of the thermoelectric system includes circuitry for determining an operational state of the gas turbine engine and for selectively operating to either supply electric power to the thermoelectric layer or extract electric power from the thermoelectric layer based on the determined operational state.

Turbine engine controller 30 selectively operates thermoelectric section 34 to enable controlled heat flow between lubrication system 22 and fuel system 24 as suggested in FIG. 2. Further, turbine engine controller 30 may operate thermoelectric section 34 to extract electric power from the thermal differential between systems 22, 24 and may apply the power a load 44 of gas turbine engine 10 as suggested in FIG. 2. Turbine engine controller 30 determines a desired control of thermoelectric heat exchanger 28 based on a various turbine engine operational conditions.

Figure 3:
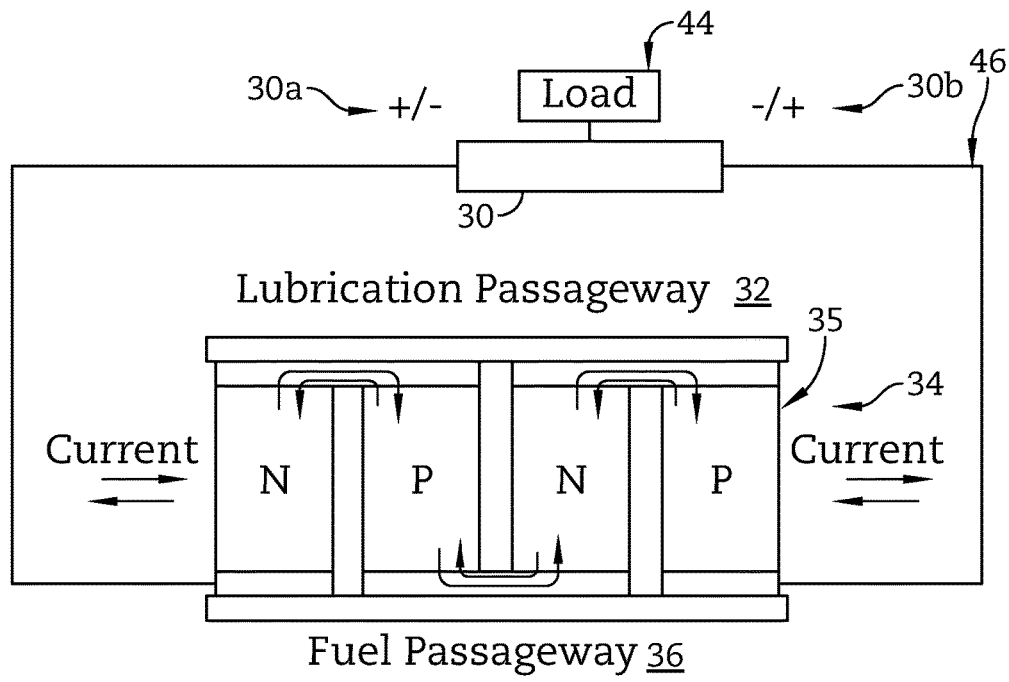
FIG. 3 is a diagrammatic view of an illustrative embodiment of the thermoelectric system of the gas turbine engine of FIG. 1 showing that thermoelectric section includes a circuit of semiconductor materials including positively charged (P-type) and negatively charged (N-type) thermoelectric materials arranged in alternating series to provide a thermoelectric circuit for receiving current therethrough in a first direction (counter-clockwise) encouraging transfer of heat through the thermoelectric section from the lubrication passageway to the fuel passageway, and in a second direction (clockwise) discouraging transfer of heat through the thermoelectric section from the lubrication passageway to the fuel passageway.

Turbine engine controller 30 is illustratively electrically connected to thermoelectric section 34 as shown in FIG. 2. Turbine engine controller 30 regulates the rate of heat flow between lubrication system 22 and fuel system 24 by controlling the amount and direction of electric current directed to thermoelectric section 34 or by controlling electric current withdrawn from thermoelectric section 34. Controller 30 regulates the direction of electric current directed through thermoelectric material 35 by selective application of the polarity of the voltage applied to thermoelectric section 34. Controller 30 is illustratively connected to thermoelectric section 34 by wiring 46 in a closed circuit. Controller 30 selectively applies voltage to thermoelectric section 34 with particular polarity by inducing either a positive or negative pole at one terminal 30a, 30b, and the other of a positive or negative pole at the other terminal 30a, 30b. In FIG. 3, controller 30 thus selectively directs current through thermoelectric section 34 in a first direction (counter-clockwise) or a second direction (clockwise).

If controller 30 determines that the desired control requires a certain amount of heat transfer from lubrication system 22 to fuel system 24, turbine engine controller 30 illustratively applies a voltage across thermoelectric section 34 through wiring 46 with polarity according to the desired heat flow. If instead, controller 30 determines that the desired control requires extraction of electrical power from thermoelectric section 34, controller 30 directs electric power generated by thermoelectric section 34 to a load 44 of the gas turbine engine 10. Heat within lubrication system 22 and fuel system 24 can therefore be used according to gas turbine engine 10 operation.

In the illustrative embodiment as shown in FIG. 3, current flow through thermoelectric section 34 in the first direction (counter-clockwise) causes thermoelectric material 35 to encourage heat flow from lubrication passageway 32 to fuel passageway 36. Current flow through thermoelectric section 34 in the second direction (clockwise) causes thermoelectric material 35 to discourage heat flow from lubrication passageway 32 to fuel passageway 36. Thus, by selectively applying voltage of a particular polarity (and thus current of a particular direction), controller 30 regulates the rate of heat flow through thermoelectric heat exchanger 28. In the foregoing description, the directions of electric current flow are used for non-limiting illustration purposes. In some embodiments, the absolute direction of current flow may differ from the description based on the particular geometric configuration of the thermoelectric section 34.

In the illustrative embodiment as shown in FIG. 3, current flow through thermoelectric section 34 in the first direction (counter-clockwise) causes thermoelectric material 35 to encourage heat flow from lubrication passageway 32 to fuel passageway 36. Current flow through thermoelectric section 34 in the second direction (clockwise) causes thermoelectric material 35 to discourage heat flow from lubrication passageway 32 to fuel passageway 36. Thus, by selectively applying voltage of a particular polarity (and thus current of a particular direction), controller 30 regulates the rate of heat flow through thermoelectric heat exchanger 28. In the foregoing description, the directions of electric current flow are used for non-limiting illustration purposes. In some embodiments, the absolute direction of current flow may differ from the description based on the particular geometric configuration of the thermoelectric section 34.

Returning to the illustrative embodiment as shown in FIGS. 1-3, thermoelectric system 26 operates according to the operating conditions of gas turbine engine 10. When the controller 30 determines that the lubrication system 22 may benefit from extraction of additional heat (i.e., additional cooling) than is available and/or useful within the fuel system 24, the controller 30 illustratively extracts electrical power from thermoelectric section 34 generated by thermoelectric material 35, effectively serving as an additional heat sink. In one example, electric power may be directed out of thermoelectric section 34 during a takeoff operational state of the engine 10 when lubricant temperature may be high.

When controller 30 determines that the lubrication system 22 requires heat removal and/or fuel system 24 would benefit from supplemental heat, controller 30 illustratively directs current through thermoelectric section 34 in the direction corresponding to provide a determined amount of heat flow toward fuel passageway 36; for example, directing current through thermoelectric section 34 in the first direction such that additional heat is pumped into fuel system 24 within fuel passageway 36 during a climb or a cruise operational state of the engine 10 when fuel flow rates are normal. Accordingly, fuel of fuel system 24 is warmed ahead of being discharged in the combustor 16 and may be more efficiently burned.

When controller 30 determines that lubrication system 22 might allow low heat removal and/or fuel system 24 requires little or no supplemental heat, controller 30 directs current in the second direction to discourage heat flow between fuel passageway 36 and lubrication passageway 32. In this exemplary scenario, controller 30 illustratively determines and directs a predetermined amount of current to thermoelectric section 34 required to resist or block heat exchange between lubrication passageway to fuel passageway 36, based on the turbine engine operating conditions. In one example, the controller 30 operates thermoelectric heat exchanger 28 to resist heat flow toward fuel passageway 36 by inputting electric current during turbine engine 10 idle operational states when fuel flow rates are relatively low and supplemental heat requirement and/or capacity of the fuel system 24 is limited. Accordingly, coking of fuel in passageway 36 through the engine 10 may be reduced.

In the illustrative embodiment, the amount of current directed through thermoelectric section 34 has a proportional relationship to the magnitude of the influence that thermoelectric section 34 exerts on heat flow between lubrication system 22 and fuel system 24. A greater amount of current directed through thermoelectric section 34 in a given direction (first or second) yields a greater influence (encouragement or discouragement) on the heat flow between systems 22, 24. A lesser amount of current directed through thermoelectric section 34 in a given direction (first or second) yields a lesser influence on heat flow between systems 22, 24. However, this proportional relationship is not necessarily linear or the same in both directions of electric current.

Referring to FIGS. 2 and 3, controller 30 can operate thermoelectric heat exchanger 28 to extract electric power from thermoelectric section 34 to load 44. In the illustrative embodiment, controller 30 includes electrical circuitry 48 (as shown in FIG. 2) configured for connection of thermoelectric section 34 to load 44 in selective arrangement to either provide or extract electric power from thermoelectric section 34. Electrical circuitry 48 illustratively includes various electrical hardware components configured to selectively provide and extract electrical power to load 44 as dictated by controller 30.

In some embodiments, hardware of electrical circuitry 48 may include any number and combination of active and/or passive components for selectively electrical connection of thermoelectric section 34 to load 44 to exchange power and condition the power exchanged therebetween. In the illustrative embodiment as shown in FIG. 2, electrical circuitry 48 is shown within the box of controller 30, but in some embodiments electrical circuitry may be wholly or partly district from, but governed by controller 30. In the illustrative embodiment, electric power provided to thermoelectric section 34 is illustratively provided by the same load 44 by configuration of electrical circuitry 48, but in some embodiments electric power may be provided to and extracted from thermoelectric section 34 via different loads.

Turbine engine controller 30 illustratively includes a processor 38, a memory device 40, and a transceiver 42 as shown in FIGS. 1 and 2. Transceiver 42 illustratively communicates signals with various gas turbine engine systems and relays the information to processor 38. Processor 38 illustratively executes instructions stored on memory device 40, based on the information from transceiver 42, to determine the desired operation of thermoelectric heat exchanger 28. In some embodiments, thermoelectric system 26 may include conditioning circuitry 50 configured to condition the flow of electric power within wiring 46.

Figure 4:
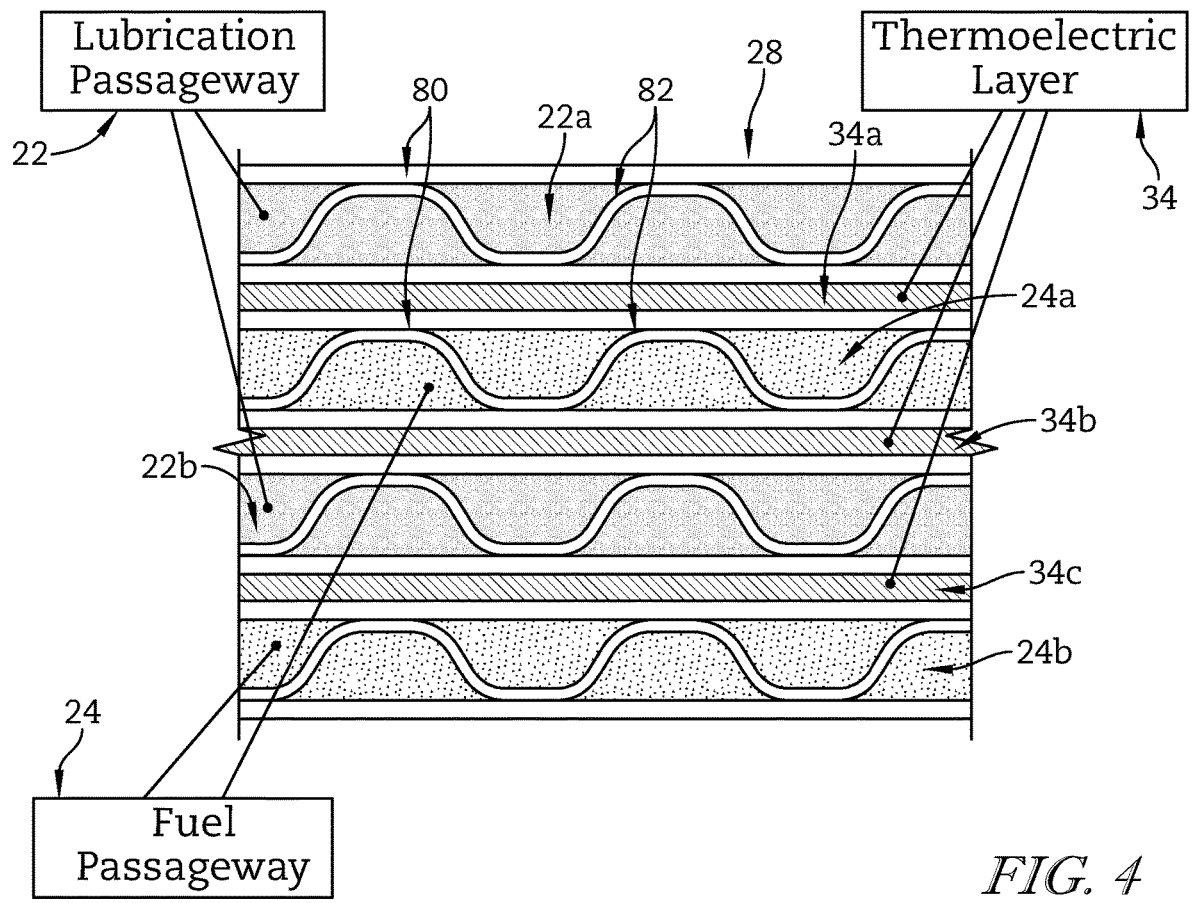
FIG. 4 is a cross-sectional representation of an illustrative embodiment of the thermoelectric heat exchanger of the gas turbine engine of FIG. 1 showing that the thermoelectric section of the thermoelectric heat exchanger includes a plurality of thermoelectric layers and showing that each of the lubrication passageway and the fuel passageway includes at least one conduit having at least one wall in thermal communication with one of the thermoelectric layers and a corrugated wall disposed within the at least one conduit.

In the illustrative embodiment as shown in FIG. 4, an internal arrangement of thermoelectric heat exchanger 28 includes lubrication passageway 22, fuel passageway 36, and thermoelectric section 34. Thermoelectric section 34 illustratively includes thermoelectric layers 34a, 34b, 34c each having thermoelectric material 35 arranged to provide thermoelectric effects as mentioned above. In the illustrative embodiment, controller 30 is electrically connected to each thermoelectric layer 34a, 34b, 34c through common wiring, but in some embodiments may be connected by individual wiring configured to permit unique electrical control of each layer.

Lubrication passageway 22 illustratively includes lubrication conduits 22a, 22b. Lubricant illustratively passes through lubrication conduits 22a, 22b in a direction into the page. Each lubrication conduit 22a, 22b is configured in thermal communication with its adjacent thermoelectric layer(s) 34a, 34b, 34c.

Fuel passageway 36 illustratively includes fuel conduits 24a, 24b. Fuel illustratively passes through fuel conduits 24a, 24b in the direction into the page. Each fuel conduit 24a, 24b is configured in thermal communication with its adjacent thermoelectric layer(s) 34a, 34b, 34c.

In the illustrative embodiment, lubrication conduit 22a and fuel conduit 24a are illustratively separated by thermoelectric layer 34a. Lubrication conduit 22b and fuel conduit 24a are illustratively separated by thermoelectric layer 34b. Lubrication conduit 22b and fuel conduit 24b are illustratively separated by thermoelectric layer 34c.

As shown in FIG. 4, each thermoelectric layer 34a, 34b, 34c, and conduits 22a, 22b, 24a, 24b is defined on either side by a wall 80. Thermoelectric layers 34a, 34b, 34c adjacent to conduits 22a, 22b, 24a, 24b share a common wall 80 across which heat exchange can take place. Conduits 22a, 22b, 24a, 24b each illustratively include a corrugated wall 82 defined therein to provide structural rigidity to the layered structure of thermoelectric heat exchanger 28. In some embodiments, the number and geometry of the layers and conduits may be adapted in any manner suitable to the specific application.

Returning to the illustrative embodiment of FIG. 1, lubrication system 22 includes pumps 84a, 84b and piping 85 configured to circulate lubricant. Piping 85 fluidly couples lubrication system 22 to lubricant passageway 32 and turbine engine 10. In the illustrative embodiment, pump 84a is configured to circulate lubricant through thermoelectric heat exchanger 34 and back to system 22 as a sump, and pump 84b is configured to circulate lubricant to portions of turbine engine 10. In some embodiments, lubricant may be directed through thermoelectric heat exchanger 28 directly to portions of turbine engine 10, and/or lubricant may be transferred by any other suitable hydraulic configuration.

Fuel system 24 includes pump 86 and piping 87 configured to deliver fuel. Piping 87 fluidly couples fuel system 24 to fuel passageway 36 and combustor 16. In the illustrative embodiment, pump 86 is configured to deliver fuel through thermoelectric heat exchanger 28 and to combustor 16. In some embodiments, fuel may be circulated through thermoelectric heat exchanger 28 to a fuel reservoir prior to delivery to combustor 16 by another pump, and/or fuel may be transferred by any other suitable hydraulic configuration.

In the illustrative embodiment, lubricant and fuel pass through their passageways 32, 36 in parallel flow, but in some embodiments may pass through their passageways 32, 36 in counter flow. In some embodiments, thermoelectric heat exchanger 28 may include any suitable manner of arrangement such as crossflow.

As previously mentioned, controller 30 regulates heat exchange through thermoelectric heat exchanger 28 (and therefore between lubrication and fuel systems 22, 24) according to various operating conditions of gas turbine engine 10 as suggested FIG. 1. Controller 30 determines the operational state of turbine engine 10 based on information received from various sources. In the illustrative embodiment, controller 30 is connected to sensors 52a, 52b, 52c to receive information therefrom. Sensors 52a, 52c, are respectively configured to determine and communicate the temperature of fuel system 24 and lubrication system 22. Sensor 52b is configured to determine and communicate the rotational speed of turbine engine 10.

Controller 30 is configured to determine the operational state of turbine engine 10 based on the received information. In the illustrative embodiment, controller 30 determines the operational state based at least on the rotational speed of turbine engine 10. In some embodiments, controller 30 may determine operational state based on any of turbine engine rotational speed, acceleration (such as engine rotation and/or vehicle movement), position (such as altitude), adapted system control conditions (such as flight controls position), and/or combinations thereof, and may do so based on one or more of past, present, and/or predicted conditions thereof. In some embodiments, operating conditions and operational states may be determined by any direct and/or indirect manner suitable for such control.

Figure 5:
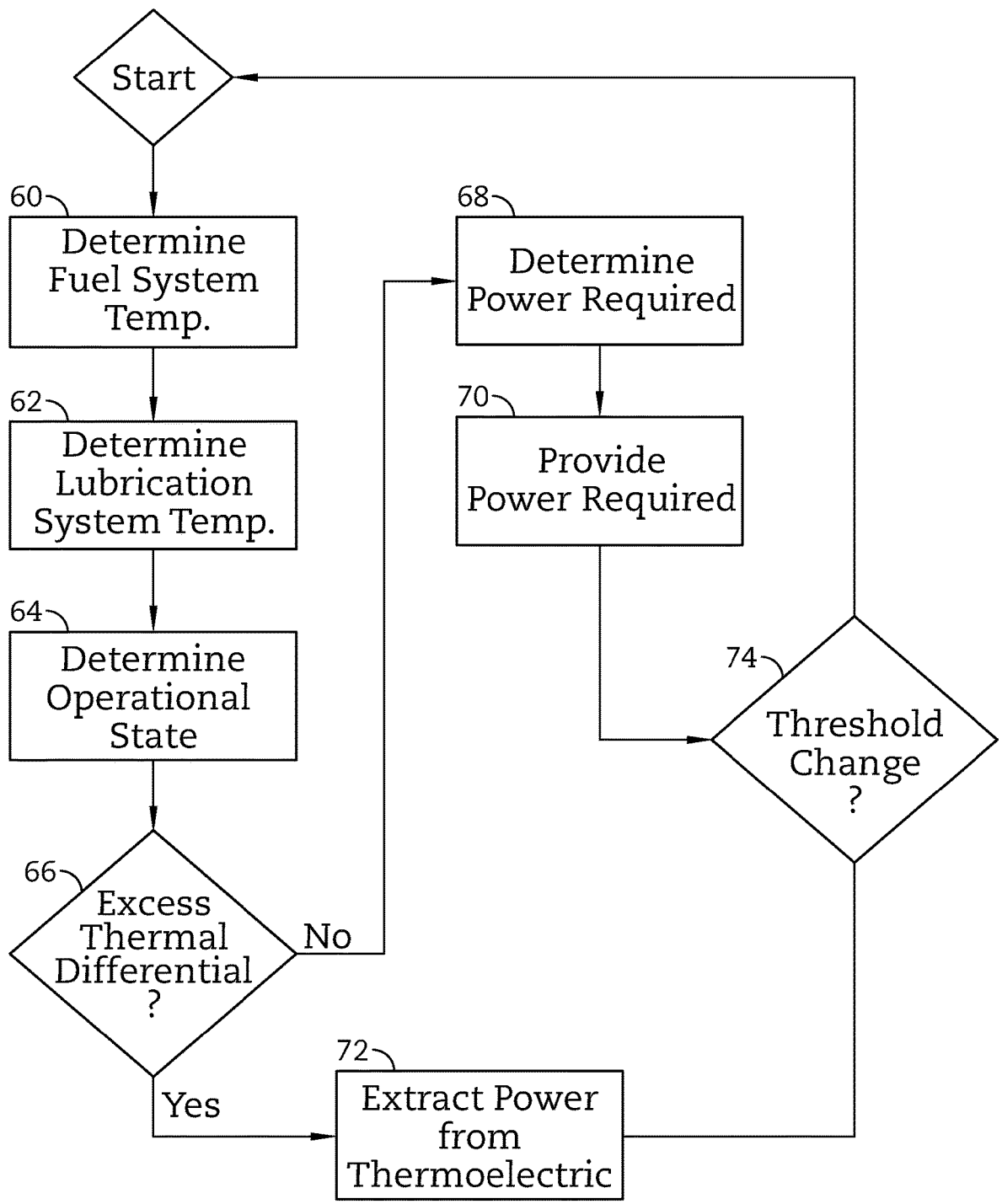
FIG. 5 is process flow diagram of a control sequence of the gas turbine engine of FIG. 1 showing that the control sequence includes determining the temperatures of the turbine engine fuel system and the gas turbine engine lubrication system, determining the operational state of the gas turbine engine, determining whether excess thermal differential exists between the turbine engine lubrication system and the turbine engine fuel system based on the determined operational state, and selectively extracting or providing electric power to the thermoelectric system based on the existence of excess thermal differential, and showing that providing electric power to the thermoelectric system includes determining the electric power required by the thermoelectric system and providing the electric power required.

Process steps 60-74 of the process flow diagram of FIG. 5 illustrate operation of thermoelectric system 26 based on operating conditions. In step 60, controller 30 determines the temperature of fuel system 24. In step 62, controller 30 determines the temperature of lubrication system 22. In step 64, controller 30 determines the operational state of turbine engine 10.

In step 66, controller 30 determines whether an excess thermal differential exists. In the illustrative embodiment, excess thermal differential exists if the temperature difference between lubrication system 22 and fuel system 24 exceeds a predetermined threshold for a given operational state of turbine engine 10. The predetermined threshold illustratively varies based on the operational state of turbine engine 10. In some embodiments, the predetermined threshold may vary based on any number of turbine engine operating conditions, for example, the absolute temperatures of lubrication system 22 and fuel system 24. In some embodiments, excess thermal differential and/or predetermined thresholds may be determined by algorithm, lookup chart, and/or any other suitable manner.

If controller 30 determines in step 66 that excess thermal differential exists, the process proceeds to step 72 as shown in FIG. 5. In step 72, controller 30 extracts electric power from thermoelectric section 34 to load 44. In the illustrative embodiment, extracting electric power includes configuration of hardware of electrical circuitry 48, as described above, to electrically connect load 44 to thermoelectric section 34 for extraction. Load 44 is illustratively embodied as a power storage device (e.g., battery) of turbine engine 10, but in some embodiments may include one more of any other electric power demands.

If controller 30 determines in step 66 that excess thermal differential does not exist, the process proceeds to step 68 as shown in FIG. 5. In step 68, controller 30 determines the amount (current) and configuration (voltage and direction) of electric power required to be directed to thermoelectric section 34 according to the operating conditions. The amount and configuration of electric power required in step 68 is illustratively embodied as the amount and configuration of electric power to be directed through thermoelectric section 34 to produce the desired rate of heat flow required based on the operational state and the operating conditions of turbine engine 10 as discussed above. In the illustrative embodiment, the amount and configuration of electric power is illustratively determined by algorithm, but in some embodiments may include one or more of lookup charts and/or any other suitable manner.

In step 70, controller 30 provides the determined amount and configuration of electric power to thermoelectric section 34, via configuration of hardware of electrical circuitry 48 as described above. In step 74, controller 30 monitors the operational state and operating parameters of turbine engine 10 for threshold changes. If no threshold change is determined, the parameters of the previous step (either 70 or 72) are maintained. If a threshold change is determined, the process returns to the start. In the illustrative embodiment, thresholds changes include changes in turbine engine operational states and exceedance of temperature thresholds of systems 22, 24, but in some embodiments may include any number and/or suitable considerations for re-evaluation of heat exchange within thermoelectric system 26.

The table of FIG. 6, illustrates exemplary operational states of the gas turbine engine 10 adapted for use in aircraft propulsion and their general correspondence to operation of thermoelectric system 26. Operation of thermoelectric system 26 includes any of the preceding descriptions and is not limited by the exemplary correspondence presented with respect to FIG. 6.

In a takeoff state, thermoelectric system 26 is illustratively configured to extract power from thermoelectric section 34 to load 44. In climb and cruise states, thermoelectric system 26 is illustratively configured to provide power into thermoelectric section 34 in a Mode A that corresponds to encouraging heat flow from lubrication system 22 to fuel system 24. The amount and configuration of electric power provided to thermoelectric section 34 in Mode A illustratively has the same direction of current for both climb and cruise states, but can vary in amperage and voltage according to the operational state and includes providing no current to thermoelectric section 34 permitting only the natural rate of heat exchange between systems 22, 24.

In ground idle and flight idle states, thermoelectric system 26 is illustratively configured to provide electric power into thermoelectric section 34 in a Mode B that corresponds to thermoelectric material 35 blocking heat flow between fuel system 24 and lubrication system 22. The amount and configuration of electric power provided to thermoelectric section 34 in Mode B illustratively has the same direction of current for both ground and flight idle states, but can vary in amperage and voltage according to the operational state.

In the illustrative embodiment, lubrication system 22 is described as the heat source relative to fuel system 24 as the heat sink, and providing electric power to thermoelectric section 34 in the second direction is illustratively embodied as providing current with a polarity and amperage determined to discourage heat transfer through thermoelectric section 34 between the lubrication system 22 and fuel system 24, up to an illustrative blocking condition in which no heat transfer occurs through thermoelectric material 35. In some embodiments, fuel system 24 may be any auxiliary system of turbine engine 10 and may be operated as either a heat source or sink depending on turbine engine operating conditions. In some embodiments, lubrication system 22 may operate as either a heat source or sink depending on turbine engine operating conditions, and controller 30 may be configured to determine and direct current to thermoelectric section 34 with a polarity and amperage determined to drive heat transfer into lubrication system 22 through thermoelectric heat exchanger 28.

The present disclosure includes devices and methods which can reduce electric power demand from generators of vehicle systems, can reduce cost and weight of systems, and improve thermodynamic performance. The present disclosure includes devices and methods for allowing heat exchange between systems of similar temperatures.

While the disclosure has been illustrated and described in detail in the foregoing drawings and description, the same is to be considered as exemplary and not restrictive in character, it being understood that only illustrative embodiments thereof have been shown and described and that all changes and modifications that come within the spirit of the disclosure are desired to be protected.

What is claimed is:
1. A gas turbine engine for generating power from combustion of fuel, comprising
   a lubrication system adapted to distribute lubricant to portions of the gas turbine engine,
   a fuel system adapted to provide fuel to a combustor of the gas turbine engine,
   a thermoelectric heat exchanger including a lubrication passageway fluidly coupled to the lubrication system to pass lubricant of the turbine lubrication system therethrough, a fuel passageway fluidly coupled to the fuel system to pass fuel of the turbine fuel system therethrough, and a thermoelectric section configured in thermal communication with each of the lubrication passageway and the fuel passageway,
   wherein the thermoelectric section is disposed between the lubrication passageway and the fuel passageway,
   a thermoelectric controller configured to determine an operational state of the gas turbine engine and to selectively apply voltage across the thermoelectric section based on the operational state of the gas turbine engine, and
   wherein the gas turbine engine is configured to provide propulsion for an aircraft and the operational state of the gas turbine engine comprises at least one of ground idle, takeoff, climb, cruise, and flight idle.

2. The gas turbine engine of claim 1, wherein the thermoelectric controller is configured to selectively provide electric power generated by the thermoelectric section to a load of the gas turbine engine.

3. The gas turbine engine of claim 1, wherein the thermoelectric controller is configured to receive electric power from the thermoelectric section in response to determination that the operational state of the gas turbine engine is takeoff.

4. The gas turbine engine of claim 1, wherein the thermoelectric controller is configured to apply voltage across the thermoelectric section to direct current through the thermoelectric section in a first direction in response to determination that the operational state of the gas turbine engine is one of climb and cruise to encourage heat transfer through the thermoelectric section from the lubrication passageway to the fuel passageway.

5. The gas turbine engine of claim 4, wherein the thermoelectric controller is configured to apply voltage across the thermoelectric section to direct current through the thermoelectric section in a second direction in response to determination that the operational state of the gas turbine engine is one of ground idle and flight idle to discourage heat through the thermoelectric section from the lubrication passageway to the fuel passageway.

6. The gas turbine engine of claim 1, wherein the thermoelectric section includes a plurality of electrically connected thermoelectric layers and the lubrication passageway includes at least one lubrication conduit having at least one wall in thermal communication with one of the thermoelectric layers.

7. The gas turbine engine of claim 6, wherein the lubrication passageway includes a corrugated wall disposed within the at least one lubrication conduit.

8. The gas turbine engine of claim 6, wherein the fuel passageway includes at least one fuel conduit having at least one wall in thermal communication with one of the thermoelectric layers and the fuel passageway includes a corrugated wall disposed within the at least one fuel conduit.

9. A gas turbine engine for generating power from combustion of fuel, comprising:
   a turbine lubrication system,
   a turbine fuel system, and
   a thermoelectric heat exchanger including:

a lubrication passageway fluidly coupled to the lubrication system to pass lubricant of the turbine lubrication system therethrough, a fuel passageway fluidly coupled to the fuel system to pass fuel of the turbine fuel system therethrough, a thermoelectric section configured in thermal communication with each of the lubrication passageway and the fuel passageway, and a thermoelectric controller configured to selectively apply voltage across the thermoelectric layer based on an operational state of the gas turbine engine and selectively provide electric power generated by the thermoelectric section to a load of the gas turbine engine.

10. The gas turbine engine of claim 9, wherein the thermoelectric controller is configured to determine the operational state of the gas turbine engine.

11. The gas turbine engine of claim 10, wherein the gas turbine engine is configured to provide propulsion for an aircraft and the operational state of the gas turbine engine comprises at least one of ground idle, takeoff, climb, cruise, and flight idle.

12. The gas turbine engine of claim 11, wherein the thermoelectric controller is configured to apply voltage across the thermoelectric section to direct current through the thermoelectric section in a first direction in response to determination that the operational state of the gas turbine engine is one of climb and cruise to encourage heat transfer through the thermoelectric section from the lubrication passageway to the fuel passageway.

13. The gas turbine engine of claim 12, wherein the thermoelectric controller is configured to apply voltage across the thermoelectric section to direct current through the thermoelectric section in a second direction in response to determination that the operational state of the gas turbine engine is one of ground idle and flight idle to discourage heat transfer through the thermoelectric section from the lubrication passageway to the fuel passageway.

14. The gas turbine engine of claim 10, wherein the thermoelectric heat exchanger is configured to provide voltage from the thermoelectric section to generate electric power from excess thermal differential between the lubrication system and the fuel system.

15. A method of operating a gas turbine engine for providing propulsion for an aircraft, the method comprising:

determining an operational state of the gas turbine engine, based on the determined operational state, determining whether excess thermal differential exists between a lubrication system and a fuel system of the gas turbine engine, wherein a thermoelectric heat exchanger of the gas turbine engine includes a lubrication passageway in fluid communication with the lubrication system and a fuel passageway in fluid communication with the fuel system, the thermoelectric heat exchanger further comprising a thermoelectric section disposed between and in thermal communication with each of the lubrication passageway and the fuel passageway, in response to determining whether excess thermal differential exists based on the determined operational state, selectively:

applying voltage across the thermoelectric section of the thermoelectric heat exchanger of the gas turbine engine in response to determination that excess thermal differential does not exist, and extracting electric power from the thermoelectric section of the thermoelectric heat exchanger in response to determination that excess thermal differential does exist.

16. The method of operating a gas turbine engine of claim 15, wherein selectively applying voltage across the thermoelectric section of the thermoelectric heat exchanger includes, in response to determination that an excess thermal differential does not exist based on the determined operational state, selectively directing current through the thermoelectric section in a first direction to encourage heat transfer through the thermoelectric section from the lubrication passageway to the fuel passageway based on the determined operational state.

17. The method of operating a gas turbine engine of claim 16, wherein selectively applying voltage across the thermoelectric section of the thermoelectric heat exchanger includes, in response to determination that an excess thermal differential does not exist based on the determined operational state, selectively directing current through the thermoelectric section in a second direction to block heat transfer through the thermoelectric section from the lubrication passageway to the fuel passageway based on the determined operational state.

* * * * *